(12) United States Patent
Park et al.

(10) Patent No.: US 8,450,826 B2
(45) Date of Patent: May 28, 2013

(54) NITRIDE BASED SEMICONDUCTOR DEVICE

(75) Inventors: Younghwan Park, Seoul (KR); Kiyeol Park, Gyeonggi-do (KR); Woochul Jeon, Gyeonggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 118 days.

(21) Appl. No.: 13/049,155

(22) Filed: Mar. 16, 2011

(65) Prior Publication Data

US 2012/0146051 A1 Jun. 14, 2012

(30) Foreign Application Priority Data

Dec. 9, 2010 (KR) .................. 10-2010-0125287

(51) Int. Cl.
*H01L 29/761* (2006.01)
*H01L 29/778* (2006.01)

(52) U.S. Cl.
USPC ............. 257/472; 257/471; 257/194; 257/77; 257/E21.403; 257/E29.246; 438/92; 438/72; 438/570; 438/572; 438/602

(58) Field of Classification Search
USPC .................. 257/471, 472, E21.403, E29.084, 257/194, 77, E29.246; 438/92, 172, 570, 438/572, 602, 167
See application file for complete search history.

(56) References Cited

U.S. PATENT DOCUMENTS

2006/0060871 A1 * 3/2006 Beach ............................. 257/94

FOREIGN PATENT DOCUMENTS

| JP | 2008-227536 | 9/2008 |
|---|---|---|
| KR | 2006-0110002 A | 10/2006 |

* cited by examiner

*Primary Examiner* — Cathy N Lam
(74) *Attorney, Agent, or Firm* — McDermott Will & Emery LLP

(57) ABSTRACT

Disclosed herein is a nitride based semiconductor device. There is provided a nitride based semiconductor device including a base substrate; a semiconductor layer disposed on the base substrate; and an electrode structure disposed on the semiconductor layer, wherein the electrode structure includes: a first electrode ohmic-contacting the semiconductor layer; a ohmic contact unit ohmic-contacting the semiconductor layer and spaced apart from the first electrode; and a schottky contact unit schottky-contacting the semiconductor layer and covering the ohmic contact unit.

16 Claims, 8 Drawing Sheets

NITRIDE BASED SEMICONDUCTOR DEVICE

CROSS REFERENCE(S) TO RELATED APPLICATIONS

This application claims the benefit under 35 U.S.C. Section 119 of Korean Patent Application Serial No. 10-2010-0125287, entitled "Nitride Based Semiconductor Device" filed on Dec. 9, 2010, which is hereby incorporated by reference in its entirety into this application.

BACKGROUND OF THE INVENTION

1. Technical Field

The present invention relates to a nitride based semiconductor device, and more particularly, to a nitride based semiconductor device capable of performing a forward operation at a low turn-on voltage and increasing withstand voltage at the time of a reverse operation.

2. Description of the Related Art

A schottky diode among semiconductor devices is a device using a schottky contact that is a junction of a metal and a semiconductor. As the schottky diodes, there is a nitride based semiconductor device using 2-dimensional electron gas (2DEG) as a current moving channel. The nitride based semiconductor device has a base substrate such as a sapphire substrate, an epitaxial growth layer disposed on the base substrate, and a schottky electrode and an ohmic electrode disposed on the epitaxial growth layer. Generally, the schottky electrode is used as an anode and the ohmic electrode is used as a cathode.

However, the nitride based semiconductor schottky diode having the above structure has a trade-off relationship between satisfying low turn-on voltage and low turn-off current and increasing withstand voltage at the time of a reverse operation. Therefore, it is very difficult to implement a technical of lowering a forward turn-on voltage while increasing the withstand voltage of a general nitride based semiconductor device at the time of the reverse operation.

SUMMARY OF THE INVENTION

An object of the present invention is to provide a nitride based semiconductor device capable of being operated at low turn-on voltage.

Another object of the present invention is to provide a nitride based semiconductor device capable of increasing withstand voltage at the time of a reverse operation.

According to an exemplary embodiment of the present invention, there is provided a nitride based semiconductor device, including: a base substrate; a semiconductor layer disposed on the base substrate; and an electrode structure disposed on the semiconductor layer, wherein the electrode structure includes: a first electrode ohmic-contacting the semiconductor layer; an ohmic contact unit ohmic-contacting the semiconductor layer and spaced apart from the first electrode; and a schottky contact unit schottky-contacting the semiconductor layer and covering the ohmic contact unit.

The schottky contact unit may have an protrusion extending to be closer to the first electrode than the side of the ohmic contact unit opposite to the first electrode in order to form a schottky contact with the semiconductor layer.

The protrusion is provided in plural and the plurality of protrusions are disposed to be spaced from each other by a predetermined interval along the side of the ohmic contact unit opposite to the first electrode.

The extensions opposite to the first electrode and the side of the ohmic contact unit may have a rugged structure, and the extensions may be provided as a convex part having the rugged structure.

The extensions may cover the side of the ohmic contact unit opposite to the first electrode in order to locally expose the side of the ohmic contact unit.

The first electrode may be used as the cathode structure of the nitride based semiconductor device and the ohmic contact unit and the schottky contact are used as the anode structure of the nitride based semiconductor device.

The base substrate may be at least one of a silicon substrate, a silicon carbide substrate, and a sapphire substrate.

The semiconductor layer may includes: a lower nitride layer using the base substrate as a seed layer and grown on the base substrate; and an upper nitride layer formed on the lower nitride layer using the lower nitride layer as the seed layer and having a wider energy band gap than the lower nitride layer; wherein 2-dimensional electron gas (2DEG) is generated between the lower nitride layer and the upper nitride layer.

According to an exemplary embodiment of the present invention, there is provided a nitride based semiconductor device, including: a base substrate; a semiconductor layer disposed on the base substrate; and an electrode structure disposed on the semiconductor layer, wherein the electrode structure includes: a cathode structure ohmic-contacting the semiconductor layer; an anode structure including a schottky contact schottky-contacting the semiconductor layer and an ohmic electrode ohmic-contacting the nitride layer; and an protrusion extending to be closer to the cathode structure than the ohmic electrode, the schottky contact including an protrusion extending to be closer to the cathode structure than the ohmic electrode.

The ohmic electrode may lower the turn-on voltage of the anode structure.

The protrusion may be provided in plural and the plurality of extensions may be disposed to be spaced from each other by a predetermined interval along the side of the ohmic electrode opposite to the cathode structure.

The protrusion may cover the side of the ohmic electrode opposite to the cathode structure so that the side of the ohmic electrode opposite to the cathode structure is locally exposed.

DESCRIPTION OF THE PREFERRED EMBODIMENTS

Figure 1:
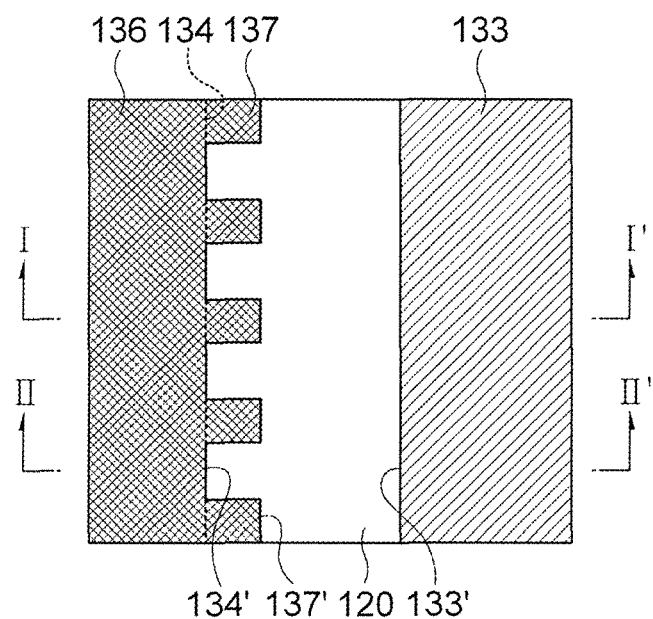
FIG. 1 is a plan view showing a nitride based semiconductor device according to an exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. Rather, these embodiments may be provided so that this disclosure will be thorough and complete, and will fully convey the scope of the invention to those skilled in the art. Like reference numerals throughout the specification denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Further, the exemplary embodiments described in the specification will be described with reference to cross-sectional views and/or plan views that are ideal exemplification figures. In drawings, the thickness of layers and regions is exaggerated for efficient description of technical contents. Therefore, exemplified forms may be changed by manufacturing technologies and/or tolerance. Therefore, the exemplary embodiments of the present invention are not limited to specific forms but may include the change in forms generated according to the manufacturing processes. For example, an etching region vertically shown may be rounded or may have a predetermined curvature. Therefore, the regions shown in the drawings have schematic attributes and the shapes shown in the drawings show specific shapes of device regions by way of example only but are not limited to the scope of the present.

Hereinafter, a semiconductor device and a method for manufacturing the same according to exemplary embodiments of the present invention will be described with reference to the accompanying drawings.

Figure 2:
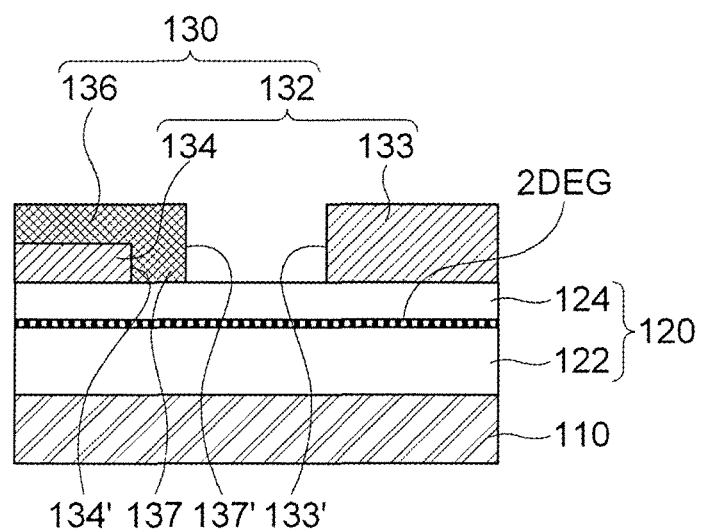
FIG. 2 is a cross-sectional view taken along line I-I' of FIG. 1.
Figure 3:
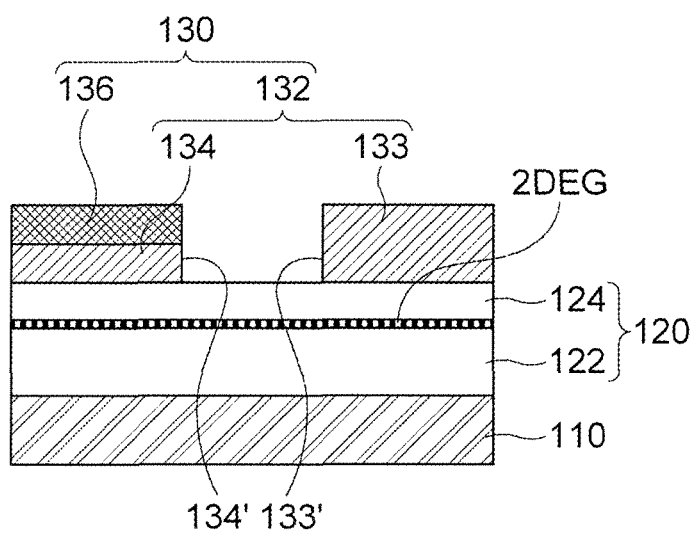
FIG. 3 is a cross-sectional view taken along line II-II' of FIG. 1.

FIG. 1 is a plan view showing a nitride based semiconductor device according to an exemplary embodiment of the present invention, FIG. 2 is a cross-sectional view taken along line I-I' of FIG. 1, and FIG. 3 is a cross-sectional view taken along line II-II' of FIG. 1.

Referring to FIGS. 1 to 3, a nitride based semiconductor device 100 according to an embodiment of the present invention may be configured to include a base substrate 110, a semiconductor layer 120, and an electrode structure 130.

The base substrate 110 may be a base for forming the semiconductor layer 120 and the electrode structure 130. As the base substrate 110, various kinds of substrate may be used. For example, as the base substrate 110, any one of a silicon substrate, a silicon carbide substrate, and a sapphire substrate may be used.

The semiconductor layer 120 may be a layer composed of a predetermined semiconductor disposed on the base substrate 110. For example, the semiconductor layer 120 may be a nitride layer formed by being subjected to an epitaxial growth process using the base substrate 110 as a seed layer. The semiconductor layer 120 may be configured to include a lower nitride layer 122 and an upper nitride layer 124 that are sequentially stacked on the base substrate 110. The upper nitride layer 124 may be made of a material having a wider energy band gap than that of the lower nitride layer 122. In addition, the upper nitride layer 124 may be made of a material having a lattice parameter different from that of the lower nitride layer 122.

For example, the lower nitride layer 122 and the upper nitride layer 124 may be layers including III-nitride based materials. In more detail, the lower nitride layer 122 may be made of any one of gallium nitride (GaN), aluminum gallium nitride (AlGaN), indium gallium nitride (InGaN), and indium aluminum gallium nitride (InAlGaN), and the upper nitride layer 124 may be made of the other one of gallium nitride (GaN), aluminum gallium nitride (AlGaN), indium gallium nitride (InGaN), and indium aluminum gallium nitride (InAlGaN). As an example, the lower nitride layer 122 may be a gallium nitride (GaN) layer, and the upper nitride layer 124 may be an aluminum gallium nitride (AlGaN) layer.

In the semiconductor layer 120, the second-dimensional electron gas (2DEG) may be generated at a boundary between the lower nitride layer 122 and the upper nitride layer 124. At the time of the switching operation of the nitride based semiconductor device 100, current may flow through the second-dimensional electron gas (2DEG).

A buffer layer (not shown) may be interposed between the base substrate 110 and the semiconductor layer 120. The buffer layer may be a layer to reduce the occurrence of defects due to a lattice mismatch between the base substrate 110 and the semiconductor layer 120. To this end, the buffer layer may have a super-lattice layer structure in which thin films made of heterogeneous materials are alternately stacked. The super-lattice layer may have a multi-layer structure in which an insulator layer and a semiconductor layer are alternately grown.

The electrode structure 130 may be disposed on the semiconductor layer 120. The electrode structure 130 may have an ohmic electrode unit 132 and a schottky contact unit 136. The ohmic electrode unit 132 ohmic-contacts the semiconductor layer 120 and the schottky contact unit 136 may be a metal layer schottky-contacting the semiconductor layer 120.

The ohmic electrode unit 132 may be configured to include a first electrode 133 and a ohmic contact unit 134. The first electrode 133 may be disposed at one area of the semiconductor layer 120. The first electrode 133 may have a plate shape. The ohmic contact unit 134 may be disposed in the other area of the semiconductor layer 120 while being spaced apart from the first electrode 133. The ohmic contact unit 134 may have a plate shape. In this case, the side of the first electrode 133 (hereinafter, 'first side 133') opposite to the ohmic contact unit 134 and the side (hereinafter, a second side 134') of the ohmic contact unit 134 opposite to the first electrode 133 may be substantially parallel with each other.

The schottky contact unit 136 may cover the ohmic contact unit 134 in the other area of the semiconductor layer 120. In more detail, the schottky contact unit 136 may be provided to cover the top surface of the ohmic contact unit 134. In addition, the schottky contact unit 136 may have an rotrusion 137 that extends toward the first electrode 133. The bottom surface of the protrusion 137 may schottky-contact the semiconductor layer 120. In addition, the protrusion 137 may have the side (hereinafter, referred to as 'a third side 137') opposite to the first side 133' of the first electrode 133. The protrusion 137 may extend so that the third side 137' is closer to the first electrode 133 than to the second side 134'.

In this configuration, the first ohmic electrode 133 may configure the cathode structure of the nitride based semiconductor device 100. In addition, the schottky contact unit 136 may configure the anode structure of the device 100, together with the ohmic contact unit 134.

Meanwhile, the schottky contact unit 136 may cover the ohmic contact unit 134 so that the second side 134' of the ohmic contact unit 134 is locally exposed toward the first electrode 133. For example, the protrusion 137 of the schottky contact unit 136 may be provided in plural. The protrusion 137 is provided in plural. In this case, the protrusions 137 may be disposed in a line while being spaced apart by a predetermined interval from the second side 134' in a parallel direction. Therefore, the protrusion 137 selectively covers a partial area of the second side 134' to locally expose the second side 134'. In this case, a portion exposed toward the first electrode 133 of the second side 134' may have an island shape. As an example, the exposed surface of the second side 134' may have a polygonal shape such as a triangular shape and a quadrangular shape or a polygonal shape of a modified shape having a partially curved shape. In certain embodiments of the present disclosure, a cover section covers the top surface of the ohmic electrode.

The electrode structure 130 having the above-mentioned structure may have the anode structure in which the plurality of ohmic contact units 134 are provided in the schottky contact unit 136. The turn-on voltage of the schottky contact unit 136 may be lowered by the ohmic contact units 134. In more detail, the turn-on voltage of the schottky contact of the anode structure may be substantially lowered to 0 by the ohmic contact units 134 ohmic-contacting the semiconductor layer 120. Therefore, the turn-on voltage at the time of the forward operation of the device 100, such that the device 100 may be operated even at the low turn-on voltage.

Next, a detailed operation process of a nitride based semiconductor device according to an exemplary embodiment of the present invention will be described in detail. In this configuration, the overlapped description of the nitride based semiconductor device 100 described with reference to FIGS. 1 and 3 may be omitted or simplified.

Figure 4A:
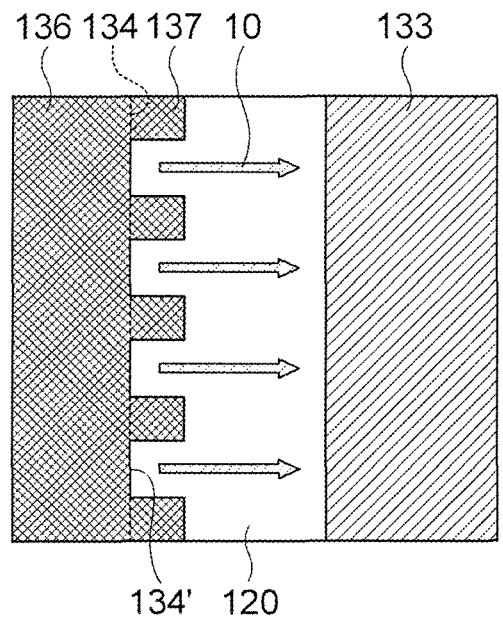
FIGS. 4A to 4D are diagrams for explaining a detailed operational process of a nitride based semiconductor device according to an exemplary embodiment of the present invention.
Figure 4B:
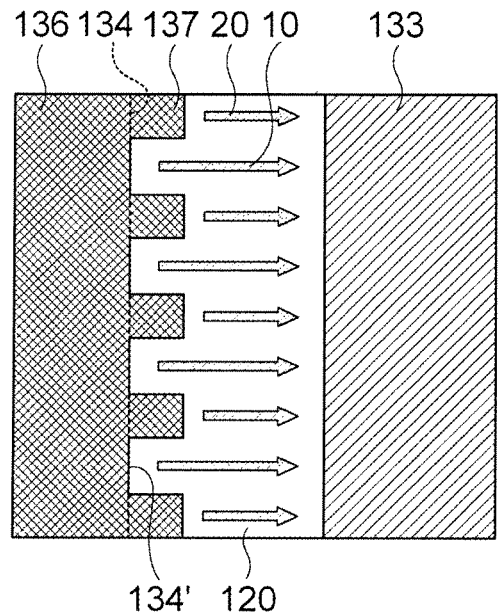
Figure 4C:
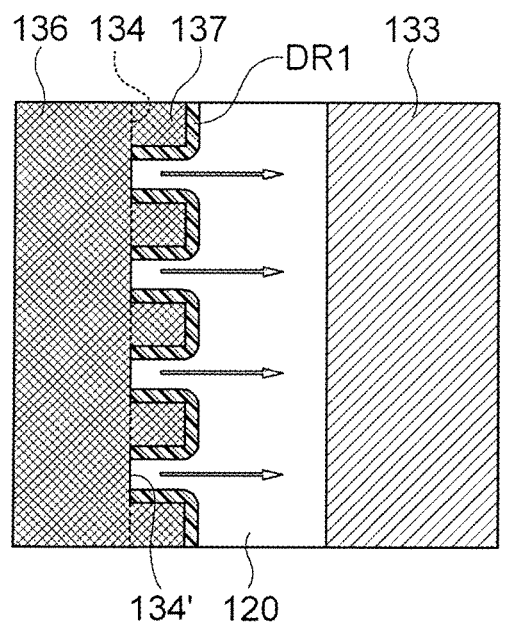
Figure 4D:
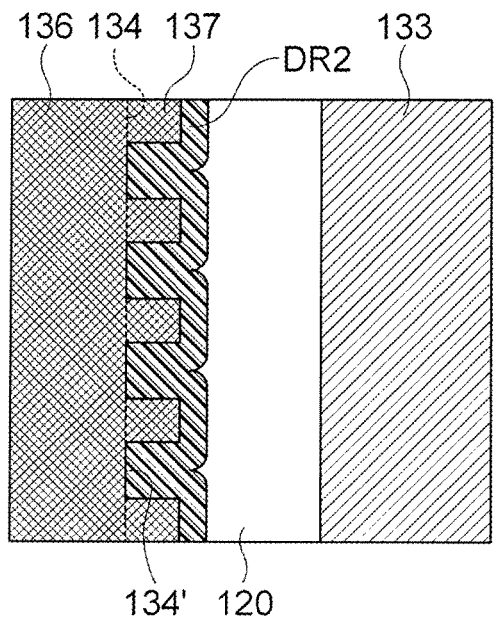

FIGS. 4A to 4D are diagrams for explaining a detailed operational process of a nitride based semiconductor device according to an exemplary embodiment of the present invention. In more detail, FIG. 4A is a diagram showing a current flow when a lower voltage than the turn-on voltage of the schottky contact is applied to the nitride based semiconductor device, when the nitride based semiconductor device according to the exemplary embodiment of the present invention is driven forward. FIG. 4B is a diagram showing a current flow when a higher voltage than the turn-on voltage of the schottky contact is applied to the nitride based semiconductor device, when the nitride based semiconductor device according to the exemplary embodiment of the present invention is driven forward. FIGS. 4C and 4D are drawing for explaining a process of blocking a current flow through the 2-D electron gas by the depletion area of the schottky contact by applying a reverse driving voltage to the nitride semiconductor device according to the exemplary embodiment of the present invention.

Referring to FIG. 4A, when the nitride based semiconductor device according to the exemplary embodiment of the present invention is driven forward at lower voltage than the turn-on voltage of the schottky contact unit 136, the current flow may be selectively flow through only the ohmic contact of the ohmic contact unit 134. That is, when the nitride based semiconductor voltage is driven forward at a lower voltage than the turn-on voltage of the schottky contact of the schottky contact unit 136, the current flow through the schottky contact unit 136 may be not generated and only the current 10 through the ohmic contact unit 134 may selectively flow. In this case, the current 10 may flow through an area locally exposed by the protrusion 137 among the second sides 134' of the ohmic contact unit 134.

Referring to FIG. 4B, when the nitride based semiconductor device according to the exemplary embodiment of the present invention is driven forward at the higher voltage than the turn-on voltage of the schottky contact unit 136, the current flow may include a current 20 through the schottky contact of the schottky contact unit 136, together with the current 10 through the ohmic contact of the ohmic contact unit 134. That is, when the nitride based semiconductor device according to the exemplary embodiment of the present invention is driven forward at a higher voltage than the turn-on voltage of the schottky contact of the schottky contact unit 136, the current 10 and 20 may flow through the ohmic contact unit 134 and the schottky contact unit 136. In this case, the current 20 through the schottky contact may flow in the protrusion 137 of the schottky contact unit 136.

Referring to FIG. 4C, when the nitride based semiconductor device according to the exemplary embodiment of the present invention starts to be applied with a reverse voltage at the time of being driven reversely, the flow of current 10 through the ohmic contact unit 134 may be blocked by a depletion region (DR1) caused by the schottky contact of the schottky contact unit 136. Further, when the magnitude in reverse voltage is increased, as shown in FIG. 4D, the flow of current 20 through the schottky contact unit 136 may be blocked by the expanded depletion area DDR2.

As described above, the nitride based semiconductor device 100 according to the exemplary embodiment of the present invention is configured to include the semiconductor layer 120 disposed on the base substrate 110 and the electrode structure 130 disposed on the semiconductor layer 120, wherein the electrode structure 130 may have a structure where the ohmic contact units 134 ohmic-contacting the semiconductor layer 120 are inserted into the schottky contact unit 136 used as the anode. In this case, the current 10 is generated through the ohmic contact units 134 at the lower voltage than the schottky contact of the schottky contact unit 136 and the current 20 may be generated through the schottky contact unit 136, together with the current 10 through the ohmic contact units 134 at the higher turn-on voltage than that of the schottky contact. Therefore, the nitride based semiconductor device according to the exemplary embodiment of the present invention moves the current through the ohmic contact when being driven at lower voltage than the turn-on voltage of the schottky contact at the forward operation and moves the current through the schottky contact with the ohmic junction when being driven the higher voltage than the turn-on voltage of the schottky contact, such that it can be operated at the lower turn-on voltage, thereby making it possible to improve the switching operation efficiency and increase the forward current amount.

Further, the nitride based semiconductor device 100 according to the exemplary embodiment of the present invention includes the ohmic contact within the schottky contact, together with the schottky contact on the anode structure, thereby making it possible to lower the electric field concentrated on the schottky contact unit 136 at the time of the reverse operation. Therefore, the nitride based semiconductor device according to the exemplary embodiment of the present invention can disperse the electric field concentrated on the schottky contact unit at the time of the reverse operation by inserting the ohmic contact into the inside of the schottky contact unit used as the anode structure, thereby making it possible to increase the withstand voltage at the time of the reverse operation.

Hereinafter, modified examples of a method for manufacturing a nitride-based semiconductor device according to another exemplary embodiment of the present invention will be described in detail. In this configuration, the overlapped description of the nitride based semiconductor device 100 described with reference to FIGS. 1 and 3 may be omitted or simplified.

Figure 5:
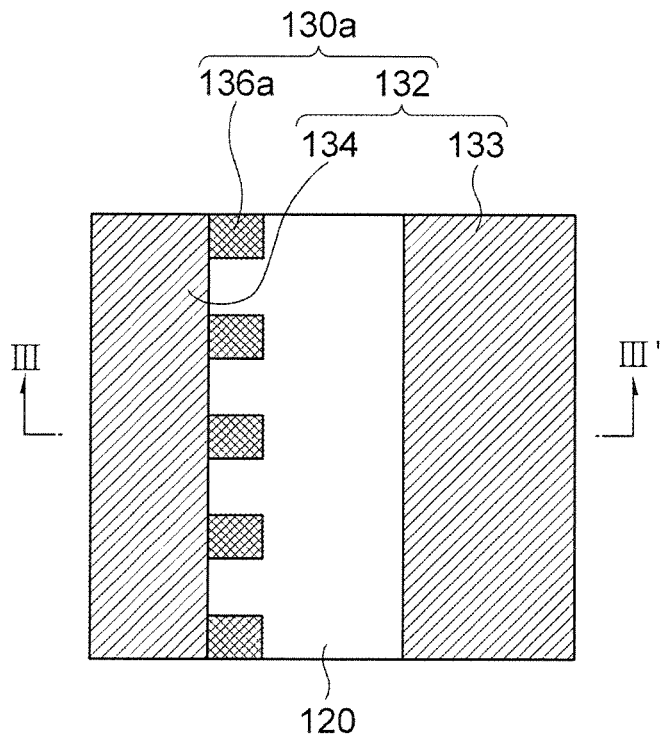
FIG. 5 is a plan view showing a modified example of a nitride based semiconductor device according to the exemplary embodiment of the present invention.
Figure 6:
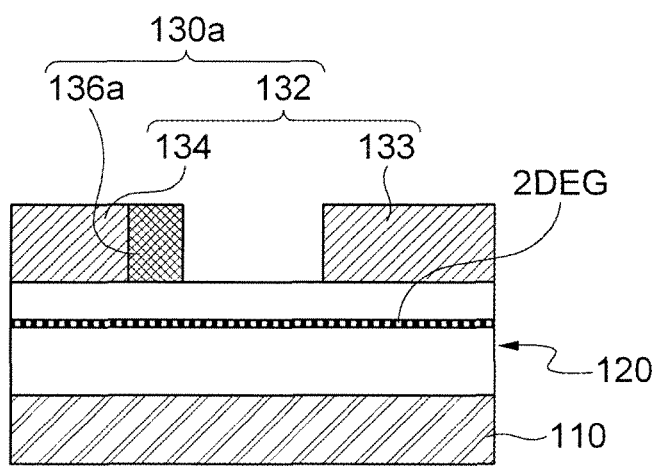
FIG. 6 is a cross-sectional view taken along line of FIG. 5.

FIG. 5 is a plan view showing a modified example of a nitride based semiconductor device according to the exemplary embodiment of the present invention and FIG. 6 is a cross-sectional view taken along line of FIG. 5.

Referring to FIGS. 5 and 6, a nitride based semiconductor device 100*a* according to one modified example of the present invention may include an electrode structure 130*a* having the anode structure different from the nitride based semiconductor device 100 with reference to FIG. 1.

In more detail, the nitride based semiconductor device 100*a* may be configured to include the base substrate 110, the semiconductor layer 120 disposed on the base substrate 110 and generating the 2-D electronic gas 2DEG therein, and the cathode structure and the anode structure disposed on the semiconductor layer 120 to be spaced apart from each other. The cathode structure includes the first electrode 133 and the anode structure may include the ohmic contact unit 134 and a schottky contact unit 136*a*. The first ohmic electrode 133 and the ohmic contact unit 134 may include the ohmic electrode unit 132 ohmic-contacting the semiconductor layer 120.

In this case, the schottky contact unit 136*a* may be disposed between the side portion of the ohmic contact unit 134 between the first electrode 133 and the ohmic contact unit 134. The schottky contact unit 136*a* may be provided in plural. In this case, each of the schottky contact units 136*a* may have an island-shaped transverse section. The schottky contact units 136*a* may be disposed in a line on the side opposite to the first electrode 133 of the ohmic contact unit 134 to be spaced from each other by a predetermined interval. The side of the anode structure opposite to the cathode structure may substantially have a rugged structure by the schottky contact units 136*a* having the above-mentioned structure and the schottky contact units 136*a* may be provided as a convex part having the rugged structure.

As shown in FIGS. 5 and 6, the schottky contact 136*a* comprises a plurality of protrusions. In certain embodiments of the present disclosure, a cover section covers the top surface of the ohmic electrode.

Figure 7:
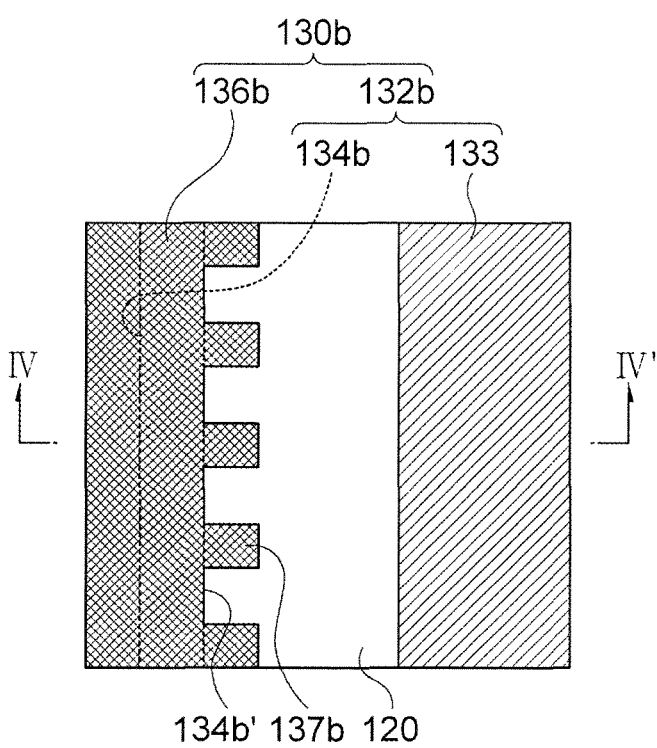
FIG. 7 is a plan view showing another modified example of a nitride based semiconductor device according to the exemplary embodiment of the present invention.
Figure 8:
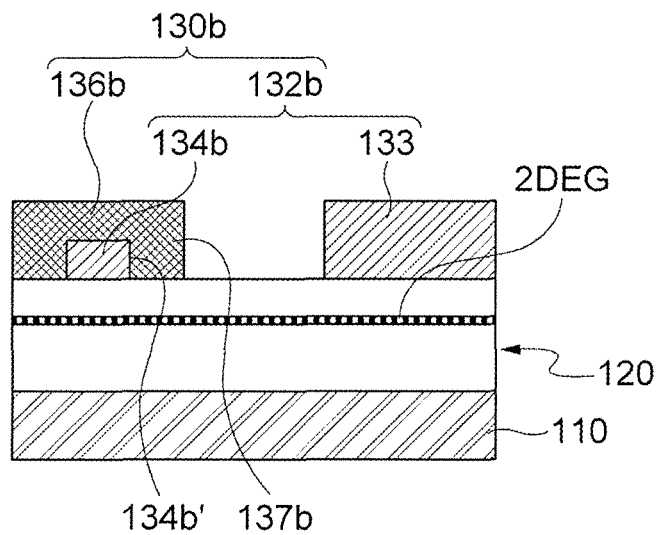
FIG. 8 is a cross-sectional view taken along line IV-IV' of FIG. 7.

FIG. 7 is a plan view showing another modified example of a nitride based semiconductor device according to the exemplary embodiment of the present invention and FIG. 8 is a cross-sectional view taken along line IV-IV' of FIG. 7.

Referring to FIGS. 7 and 8, a nitride based semiconductor device 100*b* according to another modified example of the present invention may include an electrode structure 130*b* having the anode structure different from the nitride based semiconductor device 100 with reference to FIGS. 1 to 3.

In more detail, the nitride based semiconductor device 100*b* may be configured to include the base substrate 110, the semiconductor layer 120 disposed on the base substrate 110 and generating the 2-D electronic gas 2DEG therein, and the cathode structure and the anode structure disposed on the semiconductor layer 120 to be spaced apart from each other. The cathode structure includes the first electrode 133 and the anode structure may include a ohmic contact unit 134*b* and a schottky contact unit 136*b*. The first electrode 133 and the ohmic contact unit 134*b* may configure the ohmic electrode unit 132*b* ohmic-contacting the semiconductor layer 120.

The schottky contact unit 136*b* may be configured to cover the ohmic contact unit 134*b*. For example, the schottky contact unit 136*b* may be configured to include an protrusion 137*b* including a portion covering the top surface of the ohmic contact unit 134*b*, a portion covering a side (hereinafter, 'referred to as a fourth side 134*b*') of the ohmic contact unit 134*b* opposite to the first electrode 133, and a portion covering an opposite surface of the fourth side 134*b*'. The schottky contact unit 136*b* may have a structure covering the top surface and both surfaces of the ohmic contact unit 134*b* by the protrusion 137*b*. In certain embodiments of the present disclosure, the cover section covers the top surface of the ohmic electrode. In certain embodiments, the cover section further covers the other side of the ohmic electrode.

In this case, the protrusion 137*b* may cover the fourth side 134*b*' so that the fourth side 134*b*' is locally exposed. In more detail, the protrusion 137*b* may be provided in plural. In this case, the protrusions 137*b* may be disposed in a line to be spaced apart from each other by a predetermined interval along the fourth side 134*b*'. The side of the anode structure opposite to the cathode structure may substantially have a rugged structure by the extensions 137*b* having the above structure, wherein the protrusions 137*b* may be provided with a convex part having the rugged structure. In addition, the fourth side 134*b*' may be locally exposed toward the first electrode 133 through the concave area having the rugged structure.

Figure 9:
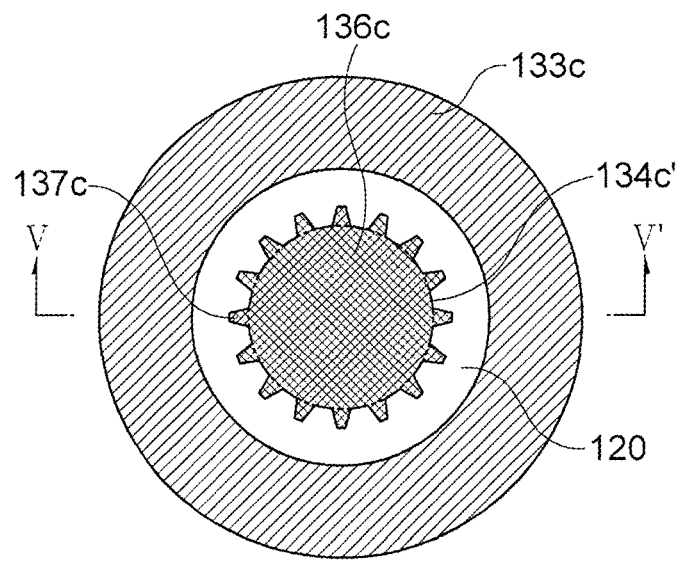
FIG. 9 is a plan view showing another modified example of the nitride based semiconductor device according to the exemplary embodiment of the present invention.
Figure 10:
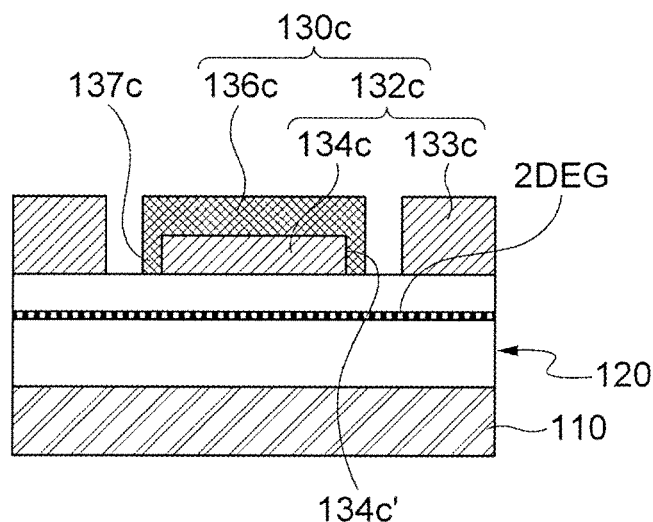
FIG. 10 is a cross-sectional view taken along line V-V' of FIG. 9.

FIG. 9 is a plan view showing another modified example of the nitride based semiconductor device according to the exemplary embodiment of the present invention and FIG. 10 is a cross-sectional view taken along line V-V' of FIG. 9.

Referring to FIGS. 9 and 10, a nitride based semiconductor device 100*c* according to another modified example of the present invention may include an electrode structure 130*c* having a circular or ring-shaped traverse section different from the nitride based semiconductor device 100 with reference to FIGS. 1 to 3.

In more detail, the nitride based semiconductor device 100*c* may be configured to include the base substrate 110, the semiconductor layer 120 disposed on the base substrate 110, and the cathode structure and the anode structure disposed on the semiconductor layer 120. The cathode structure may be configured to include the first electrode 133*c* and the anode structure may include a ohmic contact unit 134*c* and a schottky contact unit 136*c*. The first electrode 133*c* and the ohmic contact unit 134*c* may configure the ohmic electrode unit 132*c* ohmic-contacting the semiconductor layer 120.

The ohmic contact unit 134*c* is disposed at a central area of the semiconductor layer 120 and the first electrode 133*c* may be disposed to be spaced apart from the ohmic contact unit 134*c* to surround the ohmic contact unit 134*c*. Therefore, the first electrode 133*c* may have a ring shape.

The schottky contact unit 136*c* may have a portion covering the top surface of the ohmic contact unit 134*c* and an protrusion 137*c* covering a side (hereinafter, referred to as a fifth side 134*c*') of the ohmic contact unit 134*c* opposite to the first electrode 133*c*. The protrusion 137*c* may be provided in plural. In this case, the protrusions 137*c* may be disposed to be spaced apart from each other by a predetermined interval along the fifth side 134c'. The side of the anode structure opposite to the cathode structure may substantially have a rugged structure by the protrusion 137c having the above structure, wherein the protrusions 137c may be provided with a convex part having the rugged structure. In addition, the fifth side 134c' may be locally exposed toward the first electrode 133c through the concave area having the rugged structure.

Figure 11:
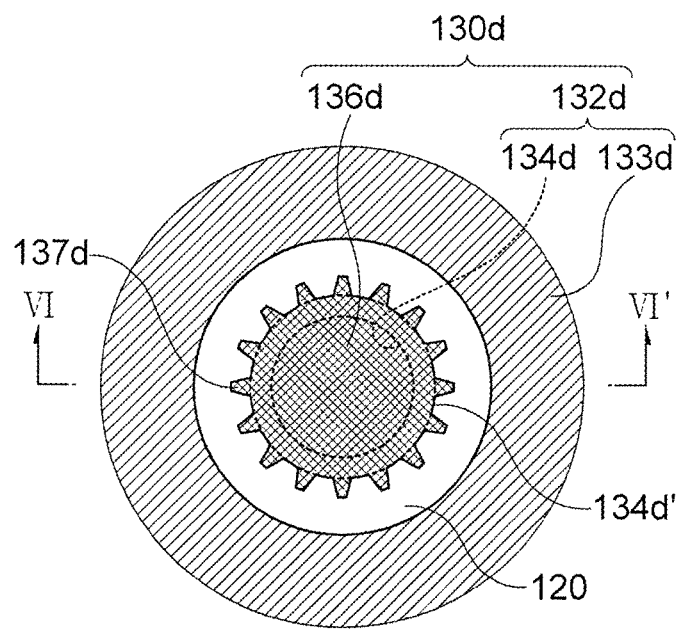
FIG. 11 is a plan view showing another modified example of the nitride based semiconductor device according to the exemplary embodiment of the present invention.
Figure 12:
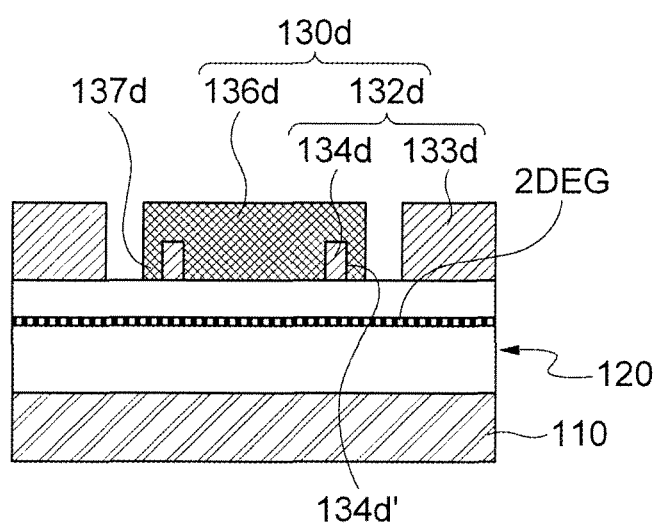
FIG. 12 is a cross-sectional view taken along line VI-VI' of FIG. 11.

FIG. 11 is a plan view showing another modified example of the nitride based semiconductor device according to the exemplary embodiment of the present invention and FIG. 12 is a cross-sectional view taken along line IV-IV' of FIG. 11.

Referring to FIGS. 11 and 12, a nitride based semiconductor device 100d according to another modified example of the present invention may include an electrode structure 130d having a circular or ring-shaped traverse section different from the nitride based semiconductor device 100 with reference to FIGS. 1 to 3.

In more detail, the nitride based semiconductor device 100d may be configured to include the base substrate 110, the semiconductor layer 120 disposed on the base substrate 110, and the cathode structure and the anode structure disposed on the semiconductor layer 120. The cathode structure may be configured to include a first electrode 133d and the anode structure may include an ohmic contact unit 134d and a schottky contact unit 136d. A first electrode 133d and an ohmic contact unit 134d may configure the ohmic electrode unit 132d ohmic-contacting the semiconductor layer 120.

The ohmic contact unit 134d is disposed at a central area of the semiconductor layer 120 and the first electrode 133d is spaced apart from the ohmic contact unit 134c to surround the ohmic contact unit 134d. Therefore, the first electrode 133d may be provided to have a ring shape in the edge area of the semiconductor layer 120.

In this case, the ohmic contact unit 134d may be provided to have a ring shape in the central area of the semiconductor layer 120. The ohmic contact unit 134d may be provided in plural. In this case, the ohmic contact units 134d are provided to have different diameters to be disposed to have an annual ring pattern.

The schottky contact unit 136d may be provided to cover the ohmic contact unit 134d. For example, the schottky contact unit 136d may have a portion covering the top surface of the ohmic contact unit 134d and an protrusion 137d covering a side (hereinafter, referred to as a sixth side 134d') of the ohmic contact unit 134d opposite to the first electrode 133d. The protrusion 137d may be provided in plural. In this case, the protrusions 137d may be disposed to be spaced apart from each other by a predetermined interval along the sixth side 134d'. The side of the anode structure opposite to the cathode structure may substantially have a rugged structure by the protrusion 137d having the above structure, wherein the protrusions 137d may be provided with a convex part having the rugged structure. In addition, the sixth side 134d' may be locally exposed toward the first electrode 133d through the concave area having the rugged structure. In certain embodiments of the present disclosure, the cover section covers the top surface of the ohmic electrode. In certain embodiments, the cover section further covers the other side of the ohmic electrode.

The nitride based semiconductor device according to the exemplary embodiment of the present invention moves the current through the ohmic contact when being driven at lower voltage than the turn-on voltage of the schottky contact and moves the current through the ohmic contact and the schottky contact when being driven the higher voltage than the turn-on voltage of the schottky contact, such that it can be operated at the lower turn-on voltage, thereby making it possible to improve the switching operation efficiency and increase the forward current amount.

Further, the nitride based semiconductor device according to the exemplary embodiment of the present invention can disperse the electric field concentrated on the schottky contact unit at the time of the reverse operation by inserting the ohmic contact into the inside of the schottky contact unit used as the anode structure, thereby making it possible to increase the withstand voltage at the time of the reverse operation.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A nitride based semiconductor device, comprising:
a base substrate;
a semiconductor layer disposed on the base substrate; and
an electrode structure disposed on the semiconductor layer, wherein the electrode structure includes:
a first electrode ohmic-contacting the semiconductor layer; and
a second electrode, spaced apart from the first electrode, having an ohmic contact unit ohmic-contacting the semiconductor layer, and a schottky contact unit including a plurality of protrusions schottky-contacting the semiconductor layer,
wherein the schottky contact unit partially covers one side of the ohmic contact unit opposite to the first electrode and partially exposes said one side of the ohmic contact unit so that the second electrode protrudes toward the first electrode.

2. The nitride based semiconductor device according to claim 1, wherein the schottky contact unit further includes a cover section being connected with the plurality of protrusions and covering a top surface of the ohmic contact unit.

3. The nitride based semiconductor device according to claim 1, wherein the plurality of protrusions are disposed to be spaced from each other by a predetermined interval along the one side of the ohmic contact unit opposite to the first electrode.

4. The nitride based semiconductor device according to claim 1, wherein the base substrate is at least one of a silicon substrate, a silicon carbide substrate, and a sapphire substrate.

5. The nitride based semiconductor device according to claim 1, wherein the semiconductor layer includes:
a lower nitride layer using the base substrate as a seed layer and grown on the base substrate; and an upper nitride layer formed on the lower nitride layer using the lower nitride layer as the seed layer and having a wider energy band gap than the lower nitride layer;

wherein 2-dimensional electron gas (2DEG) is generated between the lower nitride layer and the upper nitride layer.

6. The nitride based semiconductor device according to claim 1, wherein the first electrode is used as a cathode structure; and the second electrode is used as an anode structure.

7. The nitride based semiconductor device according to claim 6, wherein the ohmic contact unit lowers a turn-on voltage of the anode structure.

8. The nitride based semiconductor device according to claim 6, wherein the plurality of protrusions are disposed to be spaced from each other by a predetermined interval along the one side of the ohmic contact unit opposite to the cathode structure.

9. The nitride based semiconductor device according to claim 6, wherein the ohmic contact unit is disposed at a central area of the semiconductor layer, the cathode structure is disposed in an edge area of the semiconductor layer to surround the ohmic contact unit, and the plurality of protrusions are disposed along an edge area of the ohmic contact unit.

10. The nitride based semiconductor device according to claim 9, wherein the plurality of protrusions are disposed to be spaced from each other by a predetermined interval along the edge area of the ohmic contact unit.

11. The nitride based semiconductor device according to 9, wherein the ohmic contact unit has a first ring plate shape and the cathode structure has a second ring plate shape surrounding the ohmic contact unit.

12. The nitride based semiconductor device according to claim 2, wherein the cover section further covers an other side of the ohmic contact unit.

13. The nitride based semiconductor device according to claim 2, wherein the ohmic contact unit has a circular plate shape and the first electrode has a ring plate shape surrounding the ohmic contact unit.

14. The nitride based semiconductor device according to claim 12, wherein the ohmic contact unit has a first ring plate shape, the cover section further covers the inner circle area of the first ring plate shape and schottky-contacting the semiconductor layer and the first electrode has a second ring plate shape surrounding the ohmic contact unit.

15. The nitride based semiconductor device according to claim 9, wherein the schottky contact unit further includes a cover section being connected with the plurality of protrusions and covering a top surface of the ohmic contact unit.

16. The nitride based semiconductor device according to claim 6, wherein the schottky contact unit further includes a cover section being connected with the plurality of protrusions, covering a top surface and inner circle area of a first ring plate shape and schottky-contacting the semiconductor layer.

* * * * *